(12) United States Patent
Lee et al.

(10) Patent No.: US 10,741,632 B2
(45) Date of Patent: Aug. 11, 2020

(54) DISPLAY DEVICE AND MANUFACTURING METHOD THEREOF

(71) Applicant: Samsung Display Co., Ltd., Yongin-si (KR)

(72) Inventors: Pil Suk Lee, Seoul (KR); Jin Taek Kim, Yongin-si (KR); Ki Wan Ahn, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 37 days.

(21) Appl. No.: 16/236,747

(22) Filed: Dec. 31, 2018

(65) Prior Publication Data

US 2019/0206977 A1 Jul. 4, 2019

(30) Foreign Application Priority Data

Jan. 2, 2018 (KR) .................. 10-2018-0000252

(51) Int. Cl.
*H01L 27/32* (2006.01)
*H01L 51/56* (2006.01)

(52) U.S. Cl.
CPC ...... *H01L 27/3276* (2013.01); *H01L 27/3258* (2013.01); *H01L 51/56* (2013.01); *H01L 2227/323* (2013.01)

(58) Field of Classification Search
CPC . H01L 27/3276; H01L 27/3258; H01L 51/56; H01L 2227/323
See application file for complete search history.

(56) References Cited

U.S. PATENT DOCUMENTS

| 5,682,211 | A | * | 10/1997 | Yao | G02F 1/136209 349/38 |
| 6,703,992 | B1 | * | 3/2004 | Yamada | H01L 27/3244 313/463 |
| 7,696,088 | B2 |  | 4/2010 | Long et al. | |
| 8,994,886 | B2 |  | 3/2015 | Sugisaka | |
| 9,618,815 | B2 |  | 4/2017 | Lee et al. | |
| 10,551,707 | B2 | * | 2/2020 | Chong | G02F 1/1368 |
| 10,566,400 | B2 | * | 2/2020 | Kimura | H01L 27/3276 |
| 2008/0166838 | A1 | * | 7/2008 | Long | H01L 27/124 438/151 |
| 2009/0121982 | A1 | * | 5/2009 | Choi | H01L 27/3262 345/76 |
| 2010/0301345 | A1 | * | 12/2010 | Lin | H01L 27/124 257/71 |

(Continued)

FOREIGN PATENT DOCUMENTS

KR 10-1994-0016748 7/1994
KR 10-2006-0017330 2/2006

(Continued)

*Primary Examiner* — Peter Bradford
(74) *Attorney, Agent, or Firm* — H.C. Park & Associates, PLC

(57) ABSTRACT

A display device including a first signal line disposed on a substrate, a first insulating layer disposed on the first signal line, and a second signal line disposed on the first insulating layer and crossing the first signal line, in which the first insulating layer includes a recess portion providing a surface height lower than other areas of the first insulating layer, and the first signal line and the second signal line overlap each other with the recess portion therebetween.

20 Claims, 25 Drawing Sheets

(56) References Cited

U.S. PATENT DOCUMENTS

| | | | | |
|---|---|---|---|---|
| 2012/0007091 | A1* | 1/2012 | Lee | H01L 27/124 257/60 |
| 2013/0187187 | A1* | 7/2013 | Matsukura | H01L 33/62 257/99 |
| 2013/0235279 | A1* | 9/2013 | Sugisaka | G02F 1/1345 348/739 |
| 2015/0042690 | A1* | 2/2015 | Jin | H01L 27/3262 345/690 |
| 2016/0139472 | A1* | 5/2016 | Lee | G02F 1/136259 438/4 |
| 2016/0155791 | A1* | 6/2016 | Kim | H01L 27/3223 257/40 |
| 2017/0160852 | A1* | 6/2017 | Ahn | G06F 3/044 |
| 2017/0194406 | A1* | 7/2017 | Choi | H01L 27/3262 |

FOREIGN PATENT DOCUMENTS

| | | |
|---|---|---|
| KR | 10-0772939 | 11/2007 |
| KR | 10-2016-0059530 | 5/2016 |

\* cited by examiner

DISPLAY DEVICE AND MANUFACTURING METHOD THEREOF

CROSS REFERENCE TO RELATED APPLICATION

This application claims priority from and the benefit of Korean Patent Application No. 10-2018-0000252, filed on Jan. 2, 2018, which is hereby incorporated by reference for all purposes as if fully set forth herein.

BACKGROUND

Field

Exemplary embodiments of the invention relate generally to a display device and a manufacturing method thereof and, more specifically, to a display device having a structure that may prevent a signal line from being cut and a manufacturing method thereof.

Discussion of the Background

A flat panel display generally includes a liquid crystal display (LCD), a plasma display panel (PDP) device, an organic light emitting diode (OLED) device, a field effect display (FED), an electrophoretic display device, etc.

In a display device, a plurality of signal lines for providing a driving signal may overlap each other with a thick insulating layer interposed therebetween to prevent unnecessary parasitic capacitance.

However, when the thick insulating layer is interposed between signal lines which overlap and cross each other, a signal line formed on the insulating layer, which may be formed to have a shape corresponding to a step difference formed by the insulating layer and a signal line disposed thereunder, may be thinly formed, which may increase the risk of the signal line formed on the insulating layer being cut easily.

The above information disclosed in this Background section is only for understanding of the background of the inventive concepts, and, therefore, it may contain information that does not constitute prior art.

SUMMARY

Display devices constructed according to exemplary embodiments of the invention are capable of preventing a signal line from being cut due to a step formed by an insulating layer at a crossing portion of two signal lines overlapping and crossing each other with a thick insulating layer therebetween.

Additional features of the inventive concepts will be set forth in the description which follows, and in part will be apparent from the description, or may be learned by practice of the inventive concepts.

A display device according to an exemplary embodiment includes a first signal line disposed on a substrate, a first insulating layer disposed on the first signal line, and a second signal line disposed on the first insulating layer and crossing the first signal line, in which the first insulating layer includes a recess portion providing a surface height lower than other areas of the first insulating layer, and the first signal line and the second signal line overlap each other with the recess portion.

The first signal line may be a gate line, and the second signal line may be a data line.

The display device may further include an organic emission layer disposed on the substrate, in which the first signal line may be a gate line, and the second signal line may be a driving voltage line configured to apply a driving voltage to the organic emission layer.

The display device may further include a second insulating layer disposed on the second signal line and a protecting electrode, in which the second insulating layer may have an opening that exposes the second signal line disposed in a region where the first signal line and the second signal line overlap each other, and the protecting electrode may be disposed in the opening and covers the second signal.

The display device may further include a pixel electrode disposed on the substrate, in which the protecting electrode and the pixel electrode may include the same material.

A manufacturing method of a display device according to an exemplary embodiment includes forming a first signal line on a substrate, forming a first insulating layer including a recess portion to provide a surface height lower than other areas of the first insulating layer on the first signal line, and forming, on the first insulating layer, a second signal line crossing the first signal line in the recess portion of the first insulating layer.

The manufacturing method of the display device may be further include forming, on the second signal line, a second insulating layer provided with an opening that exposes the second signal line disposed in a region in which the first signal line and the second signal line overlap each other, and forming a protecting electrode covering the second signal line in the opening.

The manufacturing method may further include forming an organic emission layer on the substrate, in which the first signal line may be a gate line, and the second signal line may be a driving voltage line to apply a driving voltage to the organic emission layer.

The manufacturing method may further include the steps of: forming, on the second signal line, a second insulating layer having an opening that exposes the second signal line disposed in a region where the first signal line and the second signal line overlap each other; and forming a protecting electrode covering the second signal line in the opening.

The manufacturing method may further include forming a pixel electrode on the substrate, in which the protecting electrode and the pixel electrode may be simultaneously formed in the same layer.

The manufacturing method may further include forming a first electrode and a second electrode overlapping the organic emission layer, in which the protecting electrode and the first electrode are simultaneously formed in the same layer.

A display device according to an exemplary embodiment includes a first signal line disposed on a substrate, a first insulating layer disposed on the first signal line, and a second signal line disposed on the first insulating layer and crossing the first signal line, in which the first insulating layer has a first thickness and a second thickness less than the first thickness, and the first insulating layer has the second thickness in an area where the first signal line and the second signal line cross each other.

The first insulating layer may have a third thickness greater than the first thickness in an area of the first insulating between the first and second thicknesses.

The second signal line may overlap each portion of the first insulating layer having the first, second, and third thicknesses.

The second signal line may have a greater thickness in an area overlapping the first signal line.

A vertical distance from an upper surface of the first signal line to the substrate may be greater than a vertical distance from a lower surface of the second signal line to the upper surface of the first signal line.

According to exemplary embodiments of the invention, a signal line disposed on an insulating layer at a crossing portion of two signal lines overlapping and crossing each other with a thick insulating layer therebetween may be prevented from being thin and being cut.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
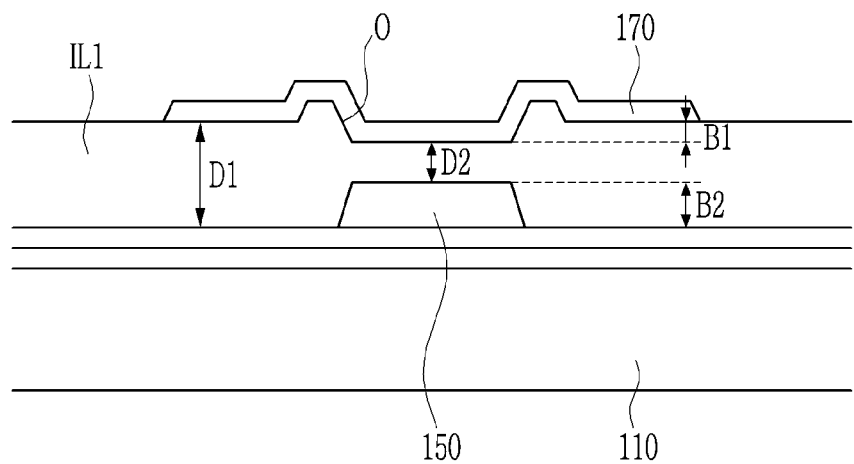
FIG. 1 is a cross-sectional view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side"

(e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an exemplary embodiment will be described with reference to the accompanying drawings. FIG. 1 is a cross-sectional view of a display device according to an exemplary embodiment.

Referring to FIG. 1, a first signal line 150 is disposed on a substrate 110, a first insulating layer IL1 is disposed on the first signal line 150, and a second signal line 170 is disposed on the first insulating layer IL1. The first signal line 150 and the second signal line 170 overlap each other with the first insulating layer IL1 therebetween. The first insulating layer IL1 has a first thickness D1 in a region where the first signal line 150 and the second signal line 170 do not overlap each other, and includes a recess portion O having a second thickness D2 less than the first thickness D1 in a region where the first signal line 150 and the second signal line 170 overlap each other. As such, since the first insulating layer IL1 includes the recess portion O to have a relatively small second thickness D2 in a region where the first signal line 150 and the second signal line 170 overlap each other, a step B1 formed at a portion of the first insulating layer IL1 disposed on the first signal line 150 may be formed smaller than a step B2 formed by the first signal line 150 disposed below the first insulating layer IL1. In this manner, a height of the first insulating layer IL1 in the recess portion O may be lower than other areas.

Since the thickness D2 of the first insulating layer IL1 disposed in the overlapping region of the first signal line 150 and the second signal line 170 is formed to be thin, the second signal line 170 overlapping the first signal line 150 is disposed on a portion of the first insulating layer IL1 where the influence of the step is relatively small. Accordingly, it is possible to prevent the second signal line 170 from being formed to have a thin thickness or being cut due to the step B1 caused by the first signal line 150 and the first insulating layer IL1. In addition, the first insulating layer IL1 includes the recess portion O in the overlapping region of the first signal line 150 and the second signal line 170. Since the second signal line 170 is formed in the recess portion O having a lower height, the second signal line 170 may be formed to be thicker than would otherwise.

Figure 2:
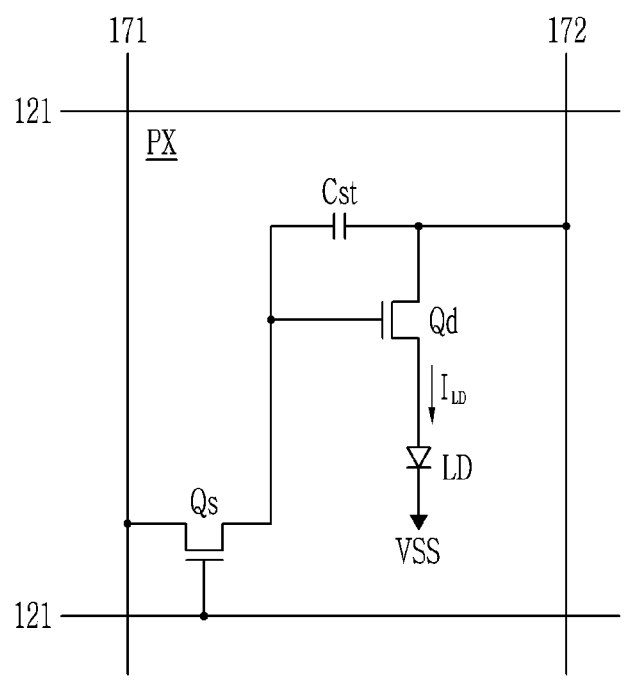
FIG. 2 is an equivalent circuit diagram of one pixel of a display device according to an exemplary embodiment.

FIG. 2 is an equivalent circuit diagram of one pixel of a display device according to an exemplary embodiment.

Referring to FIG. 2, a display device according to an exemplary embodiment includes a plurality of signal lines 121, 171, and 172, and a pixel PX connected thereto. The pixel PX may be a minimum unit for displaying an image, and the display device displays the image through a plurality of pixels PX.

The signal lines 121, 171, and 172 include a gate line 121 for transmitting a gate signal (or a scanning signal), a data line 171 for transmitting a data signal, and a driving voltage line 172 for transmitting a driving voltage. The gate lines 121 substantially extend in a row direction and are substantially parallel to each other, and the data lines 171 substantially extend in a column direction and are substantially parallel to each other. The driving voltage lines 172 are shown as substantially extending in the column direction, however, the driving voltage lines 172 may extend in the row or column direction, or have a net-like shape.

One pixel PX includes a switching transistor Qs, a driving transistor Qd, a storage capacitor Cst, and an organic light emitting element LD.

The switching transistor Qs include a control terminal, an input terminal, and an output terminal. The control terminal is connected to the gate line 121, the input terminal is connected to the data line 171, and the output terminal is connected to the driving transistor Qd. The switching transistor Qs transmits a data signal received from the data line 171 to the driving transistor Qd in response to a scanning signal received from the gate line 121.

The driving transistor Qd also includes a control terminal, an input terminal, and an output terminal. The control terminal is connected to the switching transistor Qs, the input terminal is connected to the driving voltage line 172, and the output terminal is connected to the organic light emitting element LD. The driving transistor Qd transmits an output current ILD of which magnitude varies depending on a voltage applied between the control terminal and the output terminal.

The storage capacitor Cst is connected between the control terminal and the input terminal of the driving transistor Qd. The storage capacitor Cst is charged with the data signal applied to the control terminal of the driving transistor Qd, and maintains the charged state even after the switching transistor Qs is turned off.

The organic light emitting element LD, for example, as an organic light emitting diode (OLED), includes an anode connected to the output terminal of the driving transistor Qd and a cathode connected to a common voltage Vss. The organic light emitting element LD displays an image by emitting light with variable intensity according to the output current ILD of the driving transistor Qd. The organic light emitting element LD may include an organic material that emits one or more of three primary colors of red, green, and blue. The OLED display may display a desired image with a spatial sum of these colors. In addition, the organic light emitting element LD may emit white by combination of three primary colors, and in this case, a color filter for displaying any one of three primary colors may be provided in each pixel. Moreover, each pixel may include a sub-pixel for displaying one of the three primary colors and a sub-pixel for displaying white, and in this case, a color filter may not be provided in the pixel displaying white.

The switching transistor Qs and the driving transistor Qd may be an n-channel field effect transistor (FET), respectively, but at least one thereof may be a p-channel field effect transistor. According to an exemplary embodiment, a connection relationship between the transistors Qs and Qd, the storage capacitor Cst, and the organic light emitting element LD may be varied.

Figure 3:
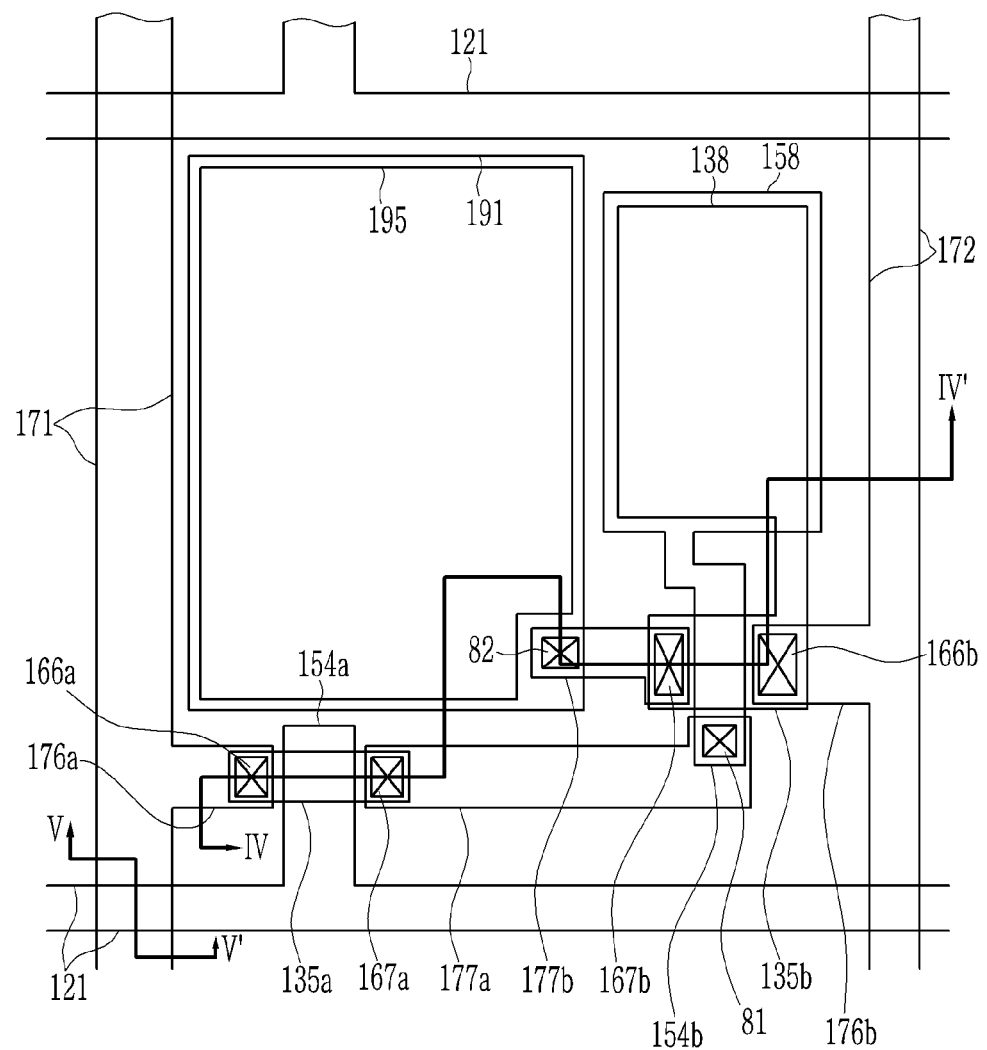
FIG. 3 is a layout view of a display device according to an exemplary embodiment.

Hereinafter, a structure of a display device according to an exemplary embodiment will be described with reference to FIGS. 2 to 5. FIG. 3 is a layout view of a display device according to an exemplary embodiment, FIG. 4 is a cross-sectional view taken along line IV-IV' of FIG. 3, and FIG. 5 is a cross-sectional view taken along line V-V' of FIG. 3.

Figure 4:
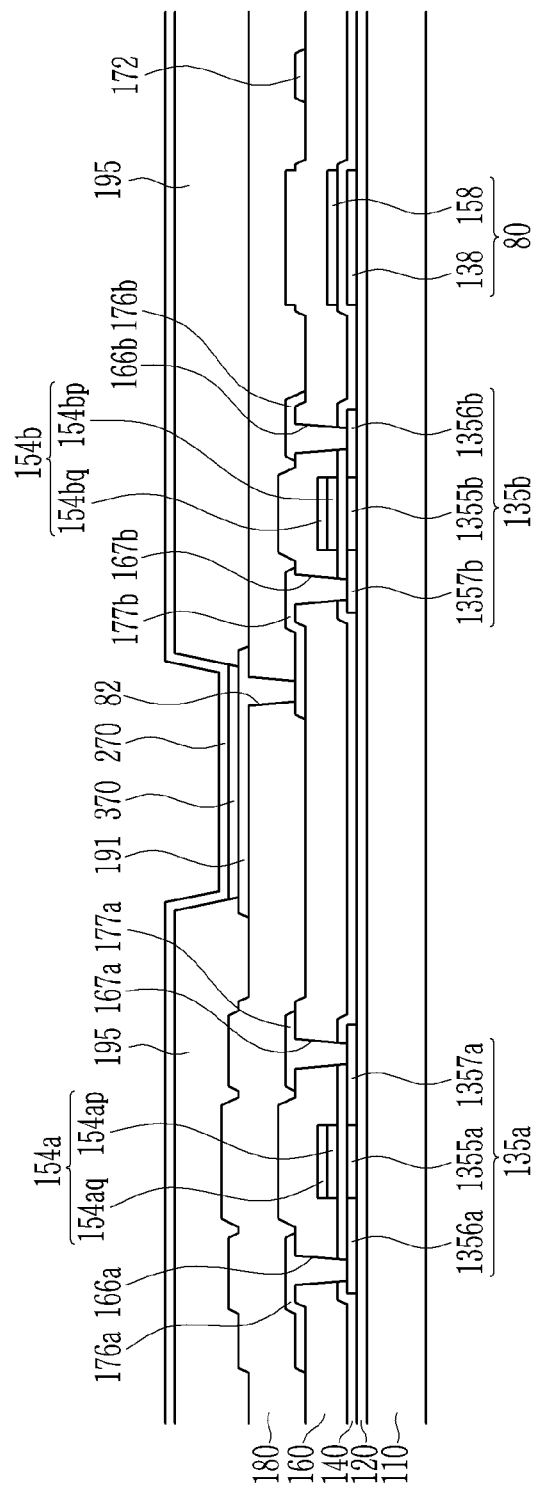
FIG. 4 is a cross-sectional view taken along line IV-IV' of FIG. 3.
Figure 5:
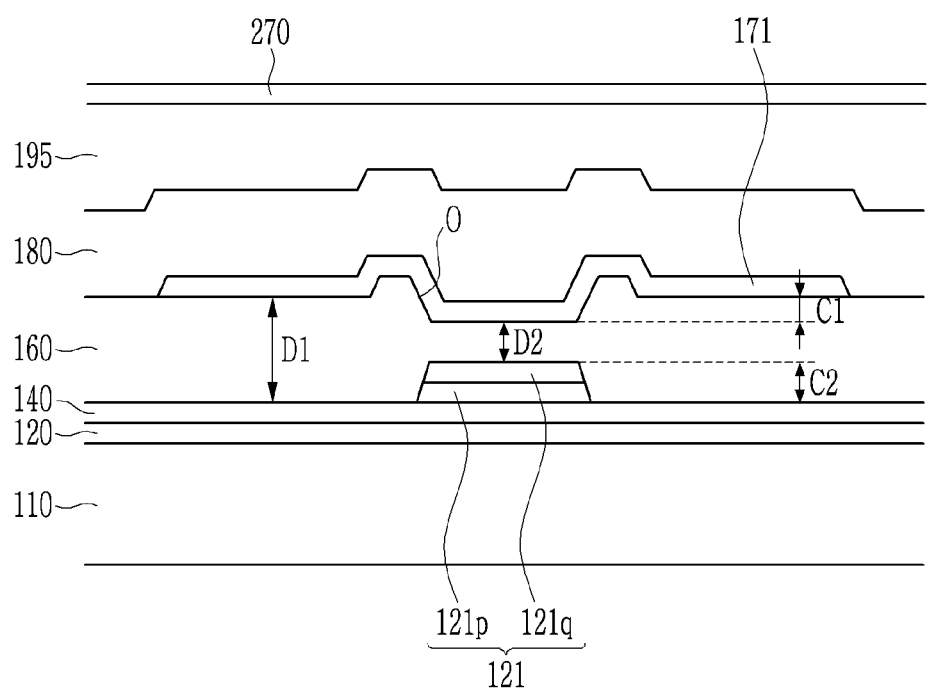
FIG. 5 is a cross-sectional view taken along line V-V' of FIG. 3.

Referring to FIGS. 3 to 5, a buffer layer 120 is disposed on the substrate 110. The substrate 110 may be an insulating substrate made of glass, quartz, ceramics, plastic, or the like, or the substrate 110 may be a metallic substrate made of stainless steel or the like. The substrate 110 may be flexible.

The buffer layer 120 may be formed with a single layer of a silicon nitride ($SiN_x$) or with a multilayer of a silicon nitride ($SiN_x$) and a silicon oxide ($SiO_x$) stacked with each other. The buffer layer 120 may flatten (or planarize) a surface of the flexible substrate 110 while preventing infiltration of undesirable materials, such as impurities or moisture.

A first semiconductor 135a and a second semiconductor 135b including polysilicon, and a first capacitor electrode 138 are disposed on the buffer layer 120.

The first semiconductor 135a is divided into a first channel region 1355a, and a first source region 1356a and a first drain region 1357a disposed at opposite sides of the first channel region 1355a.

The second semiconductor 135b is divided into a second channel region 1355b, and a second source region 1356b and a second drain region 1357b disposed at opposite sides of the second channel region 1355b.

The first channel region 1355a and the second channel region 1355b of the first semiconductor 135a and the second semiconductor 135b may be polysilicon, to which impurities are not doped, such as intrinsic semiconductors. The first source region 1356a and the first drain region 1357a of the first semiconductor 135a, and the second source region 1356b and the second drain region 1357b of the second semiconductor 135b may be polysilicon, to which impurities are doped, such as impurity semiconductors.

The first capacitor electrode 138 extends from the second source region 1356b of the second semiconductor 135b. Accordingly, the first capacitor electrode 138 may include the same material as the second source region 1356b, which may be polysilicon doped with conductive impurities, such as an impurity semiconductor.

Impurities doped in the first source region 1356a and the first drain region 1357a of the first semiconductor 135a, the second source region 1356b and the second drain region 1357b of the second semiconductor 135b, and the first capacitor electrode 138 may be any one of a p-type impurity and an n-type impurity.

A gate insulating layer 140 is disposed on the first semiconductor 135a, the second semiconductor 135b, and the first capacitor electrode 138. The gate insulating layer 140 may be a single layer or a plurality of layers including at least one of tetraethyl orthosilicate (TEOS), a silicon nitride, and a silicon oxide.

The gate line 121, a first gate electrode 154a, a second gate electrode 154b, and a second capacitor electrode 158 are disposed on the gate insulating layer 140. The gate line 121 extends substantially in a horizontal direction to transmit a gate signal, and the first gate electrode 154a protrudes from the gate line 121 toward the first semiconductor 135a.

The gate line 121, the first gate electrode 154a, and the second gate electrode 154b include lower layers 121p, 154ap, and 154bp including transparent conductors, and upper layers 121q, 154aq, and 154bq include opaque conductors that include low-resistance conductors, such as tungsten, molybdenum, aluminum, or alloys thereof.

The second capacitor electrode 158 is connected to the second gate electrode 154b, and overlaps the first capacitor electrode 138. The second capacitor electrode 158 may include the same material as the gate line 121, and the lower layers 154ap and 154bp of the first gate electrode 154a and the second gate electrode 154b. More particularly, the second capacitor electrode 158 may include a transparent conductor.

The first capacitor electrode 138 and the second capacitor electrode 158 form a first storage capacitor 80 with the gate insulating layer 140 as a dielectric material. As described above, the first capacitor electrode 138 is made of a semiconductor layer, and the second capacitor electrode 158 is made of a transparent conductor. Accordingly, since the first storage capacitor 80 is made of a transparent layer, it is possible to prevent reduction in aperture ratio of the display device due to the first storage capacitor 80.

A first interlayer insulating layer 160 is disposed on the gate line 121, the first gate electrode 154a, the second gate electrode 154b, and the second capacitor electrode 158. The first interlayer insulating layer 160 may include tetraethyl orthosilicate (TEOS), a silicon nitride, or a silicon oxide.

The first interlayer insulating layer 160 and the gate insulating layer 140 are provided with a first source contact hole 166a for exposing the first source region 1356a of the first semiconductor 135a, a first drain contact hole 167a for exposing the first drain region 1357a of the first semiconductor 135a, a second source contact hole 166b for exposing the second source region 1356b of the second semiconductor 135b, and a second drain contact hole 167b for exposing the second drain region 1357b of the second semiconductor 135b. The first interlayer insulating layer 160 is provided with a first contact hole 81 for exposing the second gate electrode 154b.

The data line 171 with a first source electrode 176a, the driving voltage line 172 with a second source electrode 176b, a first drain electrode 177a, and a second drain electrode 177b are disposed on the first interlayer insulating layer 160. The data line 171 transmits a data signal, and substantially extends in a direction crossing the gate line 121. The driving voltage line 172 may transmit a predetermined voltage, and may extend to be substantially parallel to the data line 171.

The first source electrode 176a protrudes from the data line 171 toward the first semiconductor 135a, and the second source electrode 176b protrudes from the driving voltage line 172 toward the second semiconductor 135b. The first source electrode 176a is connected to the first source region 1356a through the first source contact hole 166a, and the second source electrode 176b is connected to the second source region 1356b through the second source contact hole 166b.

The first drain electrode 177a faces the first source electrode 176a, and the first drain electrode 177a is connected to the first drain region 1357a through the first drain contact hole 167a. Similarly, the second drain electrode 177b faces the second source electrode 176b, and the second drain electrode 177b is connected to the second drain region 1357b through the second drain contact hole 167b.

The first drain electrode 177a substantially extends along the gate line, and is electrically connected to the second gate electrode 154b through the first contact hole 81.

A second interlayer insulating layer 180 is disposed on the data line 171 with the first source electrode 176a, the driving voltage line 172 with the second source electrode 176b, the first drain electrode 177a, and the second drain electrode 177b. The second interlayer insulating layer 180 may include the same material as the first interlayer insulating layer 160, and is provided with a second contact hole 82 for exposing the second drain electrode 177b.

A first electrode 191 is disposed on the second interlayer insulating layer 180. The first electrode 191 may be an anode. The first electrode 191 is connected to the second drain electrode 177b through the second contact hole 82.

A pixel defining layer 195 is disposed on the first electrode 191. The pixel defining layer 195 may include resin, such as a polyacrylate or a polyimide, or a silica-based inorganic material.

An organic emission layer 370 is disposed on the first electrode 191 that is not covered with the pixel defining layer 195. The organic emission layer 370 includes an emission layer, and may further include one or more of a hole injection layer (HIL), a hole transporting layer (HTL), an electron transporting layer (ETL), and an electron injection layer (EIL).

When the organic emission layer 370 includes all of these layers, the hole injection layer HIL may be disposed on the first electrode 191, which is an anode electrode, and the hole transporting layer HTL, the emission layer, the electron transporting layer ETL, and the electron injection layer EIL may be sequentially stacked thereon. The organic emission layer 370 may emit light of one of three primary colors, such as red, green, and blue.

A second electrode 270 is disposed on the pixel defining layer 195 and the organic emission layer 370. The second electrode 270 is a cathode of the organic light emitting element. Accordingly, the first electrode 191, the organic emission layer 370, and the second electrode 270 form the organic light emitting element LD.

The second electrode 270 may include a reflective layer, a transparent layer, or a transflective layer. The reflective layer and the transflective layer may include one or more metals of magnesium (Mg), silver (Ag), gold (Au), calcium (Ca), lithium (Li), and chromium (Cr), or an alloy thereof. The reflective layer and the transflective layer are determined by their thicknesses, and the transflective layer may have a thickness of 200 nm or less. The transparent layer may include a material, such as indium tin oxide (ITO), indium zinc oxide (IZO), or zinc oxide (ZnO).

Referring to FIG. 3, the gate line 121 extends in different direction with the data line 171 and the driving voltage line 172. The gate line 121 crosses and overlaps the data line 171 and the driving voltage line 172 with the first interlayer insulating layer 160 therebetween.

As described above, the gate line 121 is disposed on the gate insulating layer 140, and the gate line 121 includes a lower layer 121p and an upper layer 121q. The first interlayer insulating layer 160 is disposed on the gate line 121, and the data line 171 is disposed on the first interlayer insulating layer 160.

Hereinafter, an overlapping region of two signal lines, for example, the gate line 121 and the data line 171, will be described with reference to FIG. 5 together with FIG. 3.

The gate line 121 and the data line 171 partially overlap each other with the first interlayer insulating layer 160 therebetween. The first interlayer insulating layer 160 includes the recess portion O disposed at a portion where the gate line 121 and the data line 171 overlap each other. The first interlayer insulating layer 160 has the first thickness D1 in a portion where the gate line 121 and the data line 171 do not overlap each other, and has the second thickness D2 in the recess portion O, which is disposed in a portion where the gate line 121 and the data line 171 overlap each other. The second thickness D2 is less than the first thickness D1.

More particularly, in the overlapping portion, the gate line 121 and the data line 171 that are disposed at different layers and extend in different directions, cross and overlap each other. Since the first interlayer insulating layer 160 disposed between the gate line 121 and the data line 171 has the second thickness D2 that is less than the first thickness D1, the recess portion O may be formed to provide a lower height than other portions of the first interlayer insulating layer 160. As such, since the thickness of the first interlayer insulating layer 160 is reduced in the region where the two signal lines (the gate line 121 and the data line 171) overlap each other, a step C1 of the first interlayer insulating layer 160 becomes smaller than a step C2 formed by the gate line 121 disposed below the first interlayer insulating layer 160. In this manner, since the data line 171 is disposed on the first interlayer insulating layer 160 having the small step, it is possible to prevent the thickness of the data line 171 from becoming thin or the data line 171 from being cut in the region where the gate line 121 and the data line 171 overlap each other. In addition, it is possible to increase the thickness of the data line 171 formed inside the recess portion O.

In the illustrated exemplary embodiments, although the gate line 121 and the data line 171 are exemplarily described, the inventive concepts are not limited thereto, and may be applicable to an insulating layer disposed at an overlapping portion of two signal lines, which are formed on different layers with the insulating layer therebetween and crossing each other. As such, in a display device according to an exemplary embodiment, the influence of the step formed by the signal line disposed below the insulating layer may be reduced by forming a portion of the insulating layer disposed at the overlapping portion of the two signal lines, which are formed on different layers and crossing each other, to have a smaller thickness than other portions, thereby preventing the thickness of the signal line formed on the insulating layer from becoming thin or from being cut.

The structure of one pixel of the display device shown in FIGS. 2 to 4 is merely an example, and thus, the inventive concepts are not limited thereto. More particularly, the signal line and the organic light emitting element may have various configurations within a range in which a person skilled in the art may easily modify or perform. For example, FIG. 2 shows that the display device includes two thin film transistors (TFT) and one capacitor in one pixel, however, the number of thin film transistors, the number of capacitors, and the number of wires may be varied.

Figure 6:
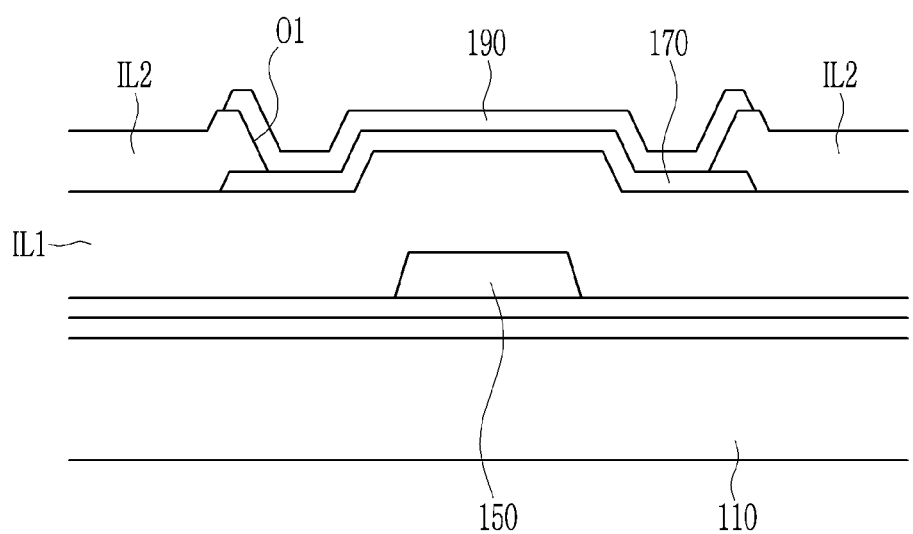
FIG. 6 is a cross-sectional view of a display device according to another exemplary embodiment.

Hereinafter, a display device according to another exemplary embodiment will be described with reference to FIG. 6. FIG. 6 is a cross-sectional view of a display device according to another exemplary embodiment.

Referring to FIG. 6, the first signal line 150 is disposed on the substrate 110, the first insulating layer IL1 is disposed on the first signal line 150, and the second signal line 170 is disposed on the first insulating layer IL1. The first signal line 150 and the second signal line 170 overlap each other with the first insulating layer IL1 therebetween.

A second insulating layer IL2 is disposed on the second signal line 170, and the second insulating layer IL2 includes an opening O1 formed to be wider than a region where the first signal line 150 and the second signal line 170 overlap each other.

The opening O1 of the second insulating layer IL2 overlaps the second signal line 170, and a passivation layer 190 is disposed on the second signal line 170 overlapping the opening O1. The passivation layer 190 includes a conductive material, and may include the same material as a pixel electrode 191.

The passivation layer 190 covers and protects the second signal line 170 disposed in a region where the first signal line 150 and the second signal line 170 overlap each other. As such, although the thickness of the second signal line 170 may be formed thin due to the step formed by the first signal line 150 and the first insulating layer IL1, thereby causing the second signal line 170 to be cut, the passivation layer 190 disposed on the second signal line 170 may connect the cut portions of the second signal line 170 to each other. As such, since the second insulating layer IL2 disposed on the overlapping region of the first signal line 150 and the second signal line 170 is provided with the opening O1 at the overlapping region of the first signal line 150 and the second signal line 170, and the passivation layer 190 covering and protecting the second signal line 170 is formed in the opening O1, although the thickness of the second signal line 170 may be decreased or cut, the influence from the damage in the second signal line 170 may be substantially reduced or eliminated.

Figure 7:
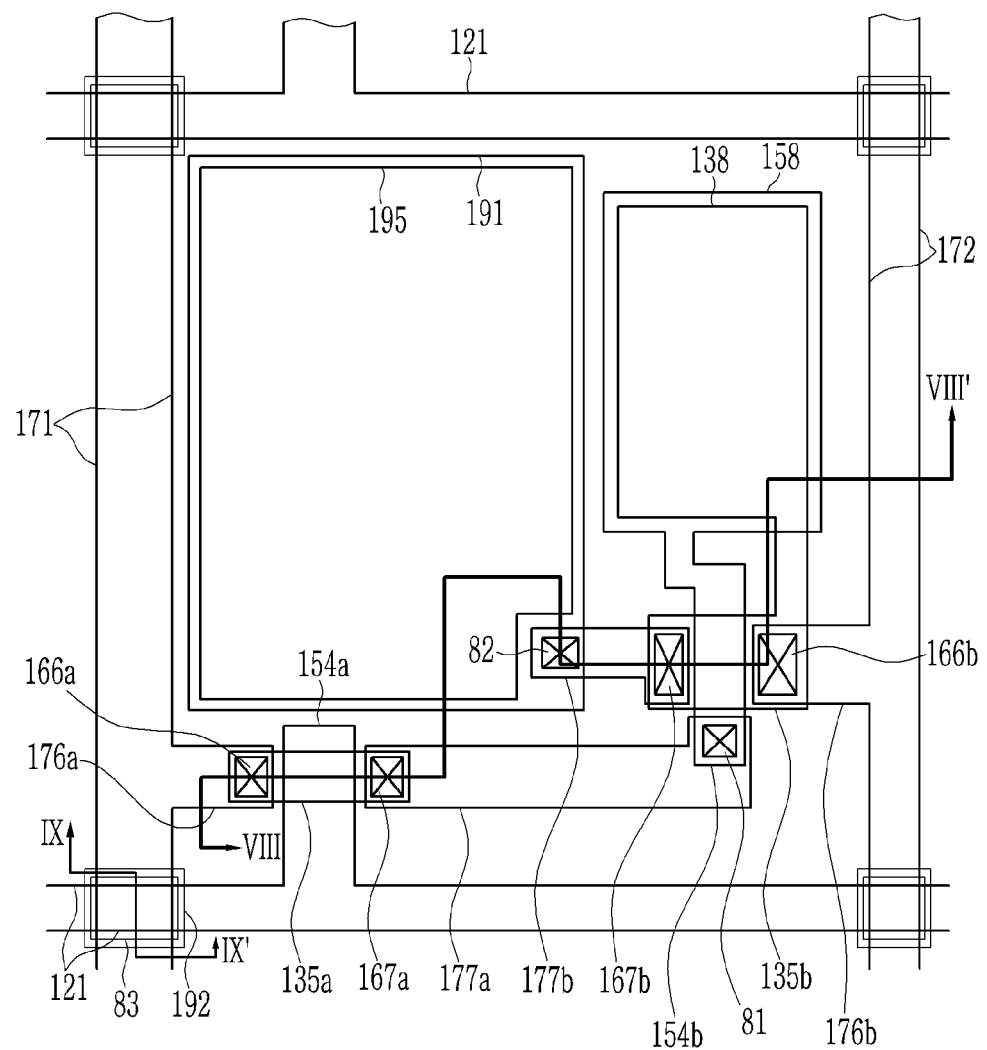
FIG. 7 is a layout view of a display device according to another exemplary embodiment.

Hereinafter, a structure of a display device according to another exemplary embodiment will be described with reference to FIG. 7 to FIG. 9. FIG. 7 is a layout view of a display device according to another exemplary embodiment, FIG. 8 is a cross-sectional view taken along line VIII-VIII' of FIG. 7, and FIG. 9 is a cross-sectional view taken along line IX-IX' of FIG. 7.

Figure 8:
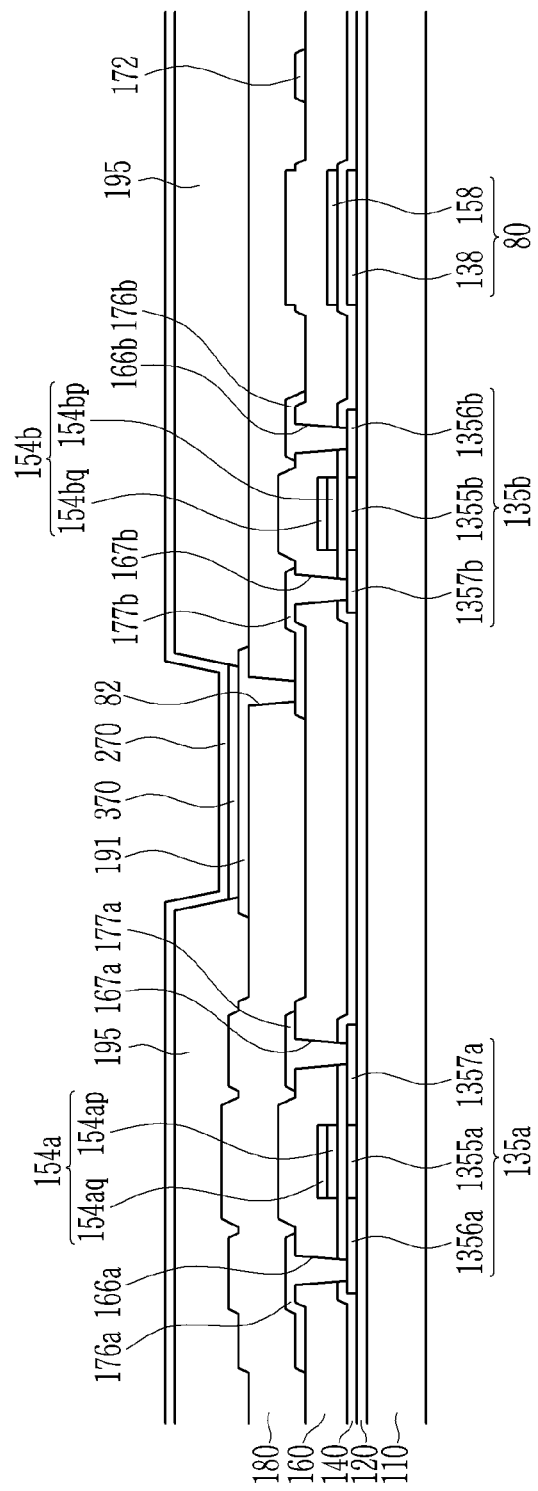
FIG. 8 is a cross-sectional view taken along line VIII-VIII' of FIG. 7.
Figure 9:
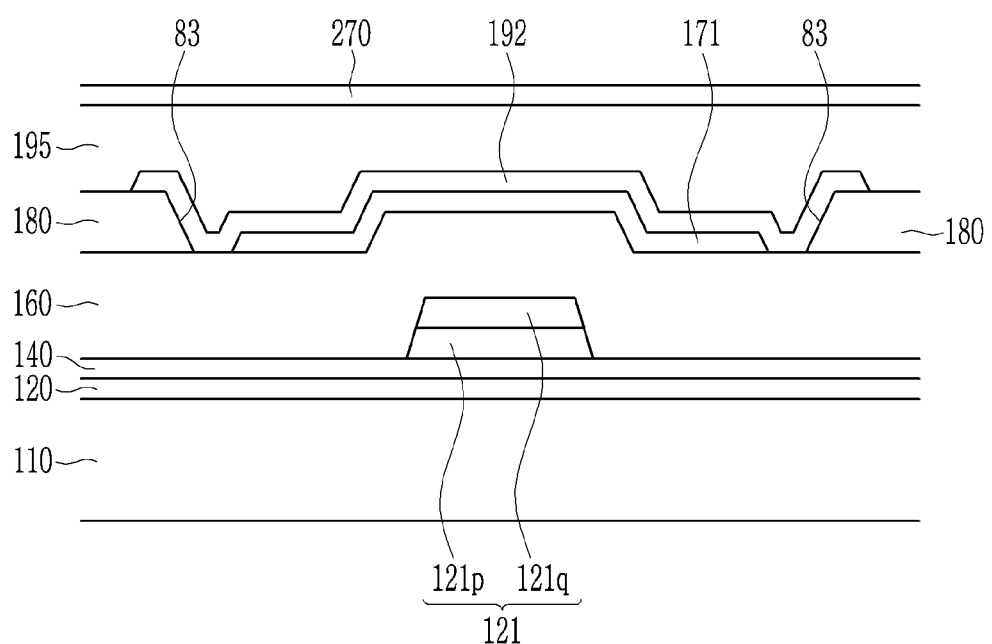
FIG. 9 is a cross-sectional view taken along line IX-IX' of FIG. 7.

The structure of the display device illustrated in FIGS. 7 to 9 is similar to that of the display device shown in FIGS. 3 to 5, and thus, repeated descriptions of the similar structure of elements will be omitted to avoid redundancy.

Referring to FIG. 7, the gate line 121 extends in different directions with the data line 171 and the driving voltage line 172, while crossing and overlapping the data line 171 and the driving voltage line 172 with the first interlayer insulating layer 160 therebetween.

As described above, the gate line 121 is disposed on the gate insulating layer 140, and the gate line 121 includes the lower layer 121p and the upper layer 121q. The first interlayer insulating layer 160 is disposed on the gate line 121, and the data line 171 is disposed on the first interlayer insulating layer 160.

An overlapping region of two signal lines, for example, the gate line 121 and the data line 171, will be described with reference to FIG. 7 to FIG. 9.

The gate line 121 and the data line 171 are disposed on different layers, and the gate line 121 and the data line 171 partially overlap each other with the first interlayer insulating layer 160 therebetween. The second interlayer insulating layer 180 is disposed on the first interlayer insulating layer 160, and the second interlayer insulating layer 180 is provided with an opening 83 overlapping the data line 171 disposed in a region where the gate line 121 and the data line 171 overlap each other. The opening 83 of the second interlayer insulating layer 180 may be simultaneously formed with the second contact hole 82 of the second interlayer insulating layer 180.

A protecting electrode 192 is disposed on the data line 171 overlapping the opening 83 of the second interlayer insulating layer 180. The protecting electrode 192 is formed of the same layer as the first electrode 191 of the organic light emitting element LD. The pixel defining layer 195 and the second electrode 270 are disposed on the protecting electrode 192.

A display device according to the illustrated exemplary embodiment, the data line 171 disposed in the region where the gate line 121 and the data line 171 overlap each other is covered by the protecting electrode 192. By covering and protecting the data line 171 disposed in the region where the gate line 121 and the data line 171 overlap each other with the protecting electrode 192, the influence from the damage of the data line 171 due to the step may be substantially reduced or eliminated.

It is also noted that the structure of the display device illustrated in FIGS. 3 to 5 is applicable to the display device according to the illustrated exemplary embodiment.

Figure 10:
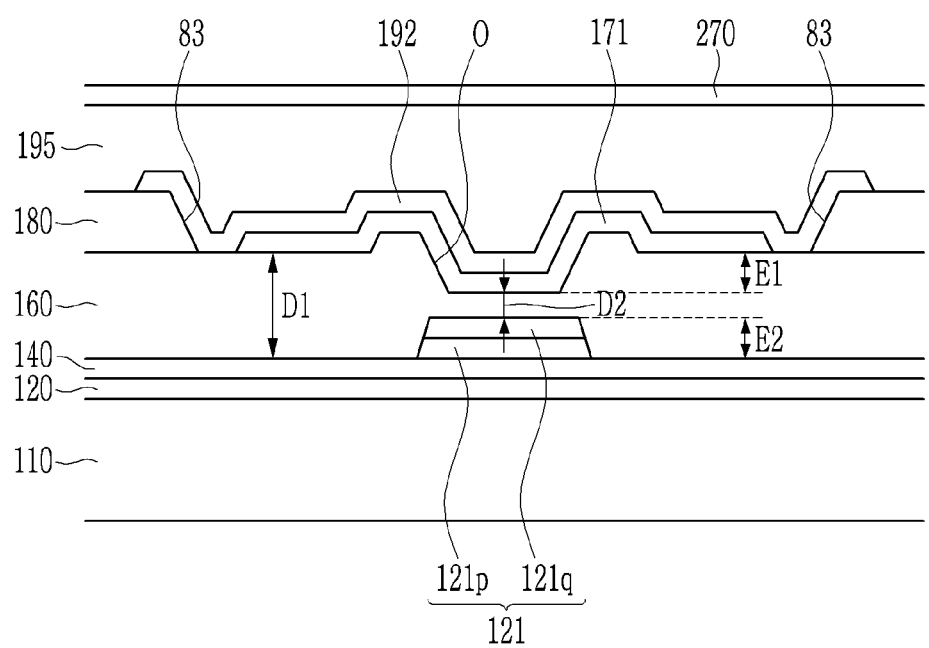
FIG. 10 is a cross-sectional view of a display device according to yet another exemplary embodiment.

A display device according to another exemplary embodiment will be described with reference to FIG. 10. FIG. 10 is a cross-sectional view of a display device according to another exemplary embodiment.

Referring to FIG. 10, the gate line 121 and the data line 171 partially overlap each other with the first interlayer insulating layer 160 therebetween. The first interlayer insulating layer 160 has the first thickness D1 at a portion where the gate line 121 and the data line 171 do not overlap each other, and has the second thickness D2 less than the first thickness D1 at a portion where the gate line 121 and the data line 171 overlap each other. The first interlayer insulating layer 160 includes the recess portion O disposed at the portion where the gate line 121 and the data line 171 overlap each other.

The second interlayer insulating layer 180 is disposed on the first interlayer insulating layer 160, and the second interlayer insulating layer 180 is provided with the opening 83 overlapping the data line 171 disposed in the region where the gate line 121 and the data line 171 overlap each other.

The protecting electrode 192 is disposed on the data line 171 overlapping the opening 83 of the second interlayer insulating layer 180. The protecting electrode 192 include the same material as the first electrode 191 of the organic light emitting element LD.

The pixel defining layer 195 and the second electrode 270 are disposed on the protecting electrode 192. As such, the thickness of the first interlayer insulating layer 160 decreases to form the recess portion O having low surficial height in the region where the gate line 121 and the data line 171 overlap each other. In this manner, the step E1 formed in the first interlayer insulating layer 160 is smaller than the step E2 formed by the gate line 121 disposed below the first interlayer insulating layer 160. As such, since the data line 171 is disposed on the first interlayer insulating layer 160 with the small step E1, it is possible to prevent the thickness of the data line 171 from becoming thin or the data line 171 from being cut in the region where the gate line 121 when the data line 171 overlap, and thus, it is possible to increase the thickness of the data line 171 formed inside the recess portion O.

In addition, the data line 171 disposed in the region where the gate line 121 and the data line 171 overlap each other is covered by the protecting electrode 192. By covering and protecting the data line 171 disposed in the region where the gate line 121 and the data line 171 overlap each other with the protecting electrode 192, the influence from the damage of the data line 171 due to the step may be substantially reduced or eliminated.

Most of the features of the display devices described in FIGS. 1 to 9 are similarly applicable to the display device according to the illustrated exemplary embodiment.

Hereinafter, a manufacturing method of the display device according to an exemplary embodiment will be described with reference to FIG. 11 to FIG. 15 together with FIG. 4 and FIG. 5. FIG. 11 to FIG. 15 are cross-sectional views illustrating a manufacturing method of a display device according to an exemplary embodiment.

Figure 11:
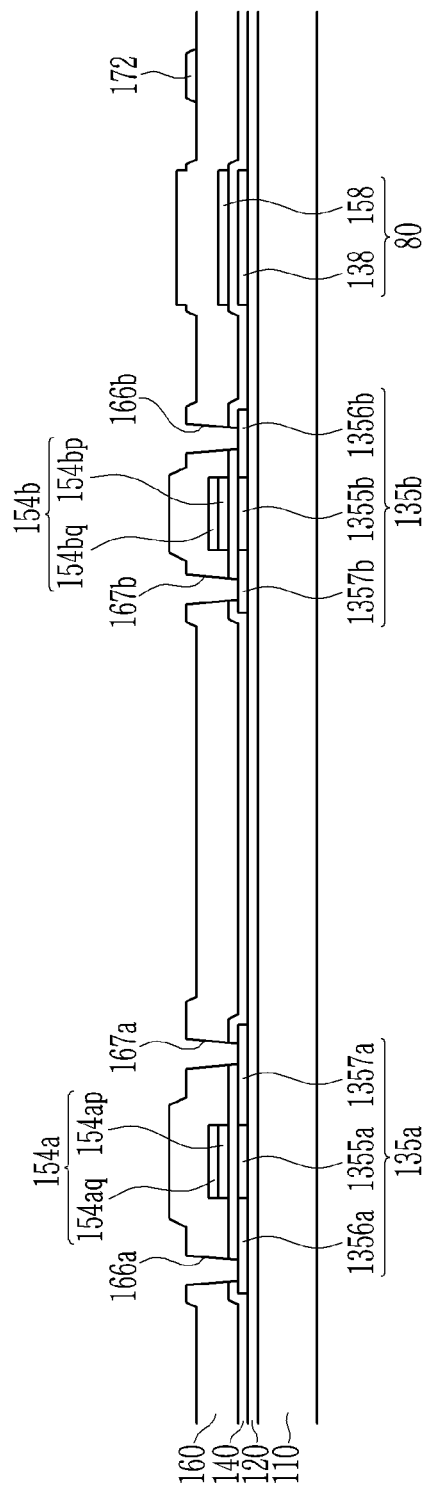
FIG. 11, FIG. 12, FIG. 13, FIG. 14, and FIG. 15 are cross-sectional views for illustrating a manufacturing method of a display device according to an exemplary embodiment.
Figure 12:
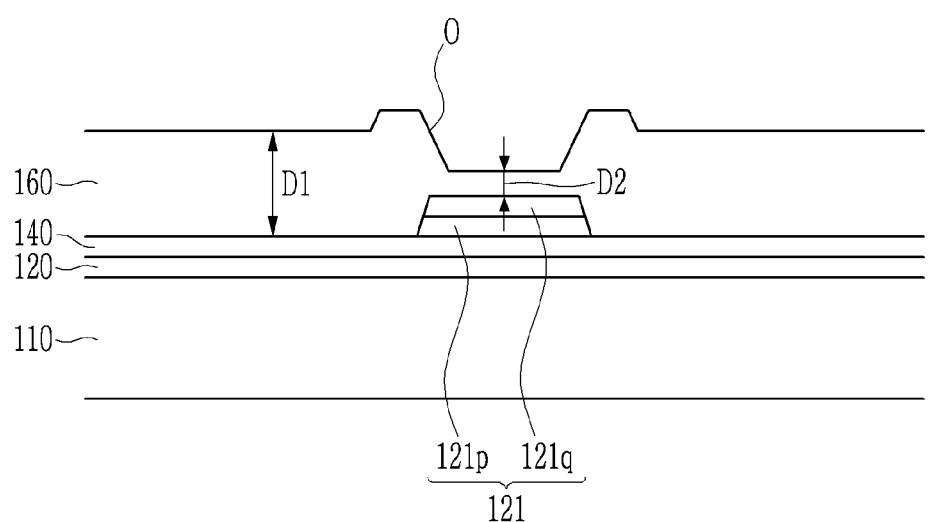

Referring to FIG. 11 and FIG. 12, the buffer layer 120, the first semiconductor 135a, the second semiconductor 135b, the first capacitor electrode 138, the gate insulating layer 140, the gate line 121, the first gate electrode 154a, the second gate electrode 154b, and the second capacitor electrode 158 are sequentially formed on the substrate 110. The first interlayer insulating layer 160 is stacked thereon, the first source contact hole 166a for exposing the first source region 1356a of the first semiconductor 135a, the first drain contact hole 167a for exposing the first drain region 1357a of the first semiconductor 135a, the second source contact hole 166b for exposing the second source region 1356b of the second semiconductor 135b, and the second drain contact hole 167b for exposing the second drain region 1357b of the second semiconductor 135b are formed in the first interlayer insulating layer 160 and the gate insulating layer 140.

In this case, the first interlayer insulating layer 160 is formed to have the first thickness D1 at a region where the gate line 121 and the data line 171 do not overlap each other. Meanwhile, the recess portion O is formed in a portion of the first interlayer insulating layer 160 where the gate line 121 and the data line 171 overlap each other, such that the first interlayer insulating layer 160 has the second thickness D2 less than the first thickness D1 to provide a lower surficial height at the portion of the first interlayer insulating layer 160 where the gate line 121 and the data line 171 overlap each other. As such, the process of forming the contact holes 166a, 166b, 167a, and 167b in the first interlayer insulating layer 160, and the process of forming the recess portion O having the second thickness D2 may be performed simultaneously through a single exposure process by using a halftone mask. Although not shown in FIGS. 11 and 12, the first contact hole 81 for exposing the second gate electrode 154b described above may also be formed in the same process.

Hereinafter, partially reducing the thickness of the insulating layer while forming contact holes therein using the halftone mask will be described with reference to FIG. 13.

Figure 13:
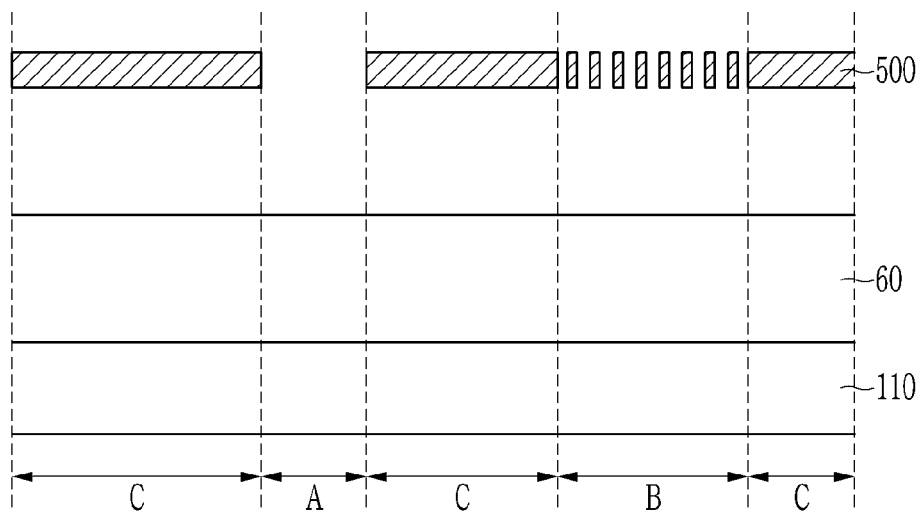

Referring to FIG. 13, an exposure mask 500 has a light-transmitting region (A), a semi-light-transmitting region (B), and a light-blocking region (C). A photosensitive layer 60 is stacked on the substrate 110 and is exposed using the exposure mask 500 having the light-transmitting region (A), the semi-light transmitting region (B), and the light-blocking region (C). As such, light is applied to the photosensitive layer 60 disposed in the light-transmitting region (A), light is not applied to the photosensitive layer 60 disposed in the light-blocking region (C), and light is partially applied to the photosensitive layer 60 disposed in the semi-light-transmitting region (B).

When the photosensitive layer 60 has positive photosensitivity, the photosensitive layer 60 exposed through the exposure mask 500 is developed, such that the photosensitive layer 60 disposed in the light-transmitting region (A) is completely eliminated. The photosensitive layer 60 disposed in the semi-light-transmitting region (B) is partially eliminated, such that the thickness of the photosensitive layer 60 may be reduced, and the thickness of the photosensitive layer 60 disposed in the light-blocking region (C) may remain without being changed. In addition, when the photosensitive layer 60 has negative photosensitivity, the photosensitive layer 60 exposed through the exposure mask 500 is developed, such that the thickness of the photosensitive layer 60 disposed in the light-transmitting region (A) remains without being changed, the photosensitive layer 60 disposed in the semi-light-transmitting region (B) may be partially eliminated to reduce the thickness of the photosensitive layer 60, and the photosensitive layer 60 disposed in the light-blocking region (C) may be completely eliminated.

For example, the regions where the photosensitive layer 60 is completely eliminated may correspond to the region where the contact holes 166a, 166b, 167a, and 167b of the first interlayer insulating layer 160 are to be formed, the region where the photosensitive layer 60 is partially eliminated to reduce the thickness of the photosensitive layer 60 may correspond to a portion of the first interlayer insulating layer 160 where the gate line 121 and the data line 171 overlap each other to have the second thickness D2, and the region where the thickness of the photosensitive layer 60 remains without being changed may correspond to a region where the contact holes 166a, 166b, 167a, and 167b are not to be formed and where the first interlayer insulating layer 160 is to be formed to have the first thickness D1.

As such, a photosensitive film pattern having three regions of different thicknesses is formed by using a halftone mask. When the first interlayer insulating layer 160 is etched by using the photosensitive film pattern, a height of the photosensitive film pattern may be partially lowered in desired areas, and then the first interlayer insulating layer 160 is etched again to form the contact holes 166a, 166b, 167a, and 167b in the first interlayer insulating layer 160. In addition, the recess portion O having the second thickness D2 less than the first thickness D1 may be formed in the first interlayer insulating layer 160 by lowering the height thereof at a portion where the gate line 121 and the data line 171 overlap each other, which may be performed through a single exposure process by using a halftone mask.

FIG. 13 illustrates that the semi-light-transmitting region (B) of the exposure mask 500 includes slits, but the semi-light-transmitting region (B) of the exposure mask 500 may alternatively have a relatively small thickness.

Figure 14:
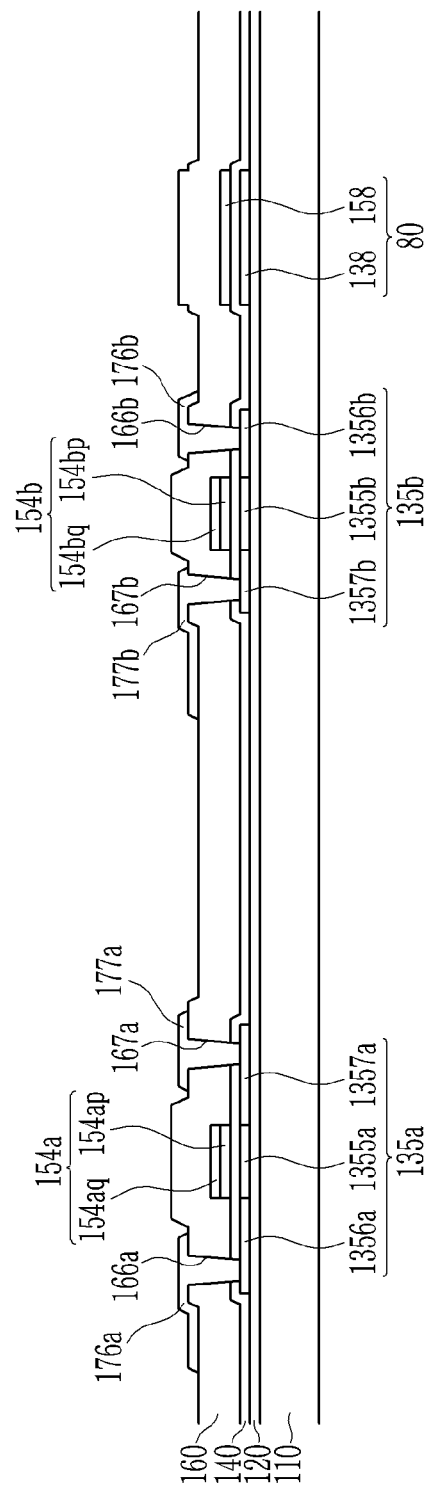
Figure 15:
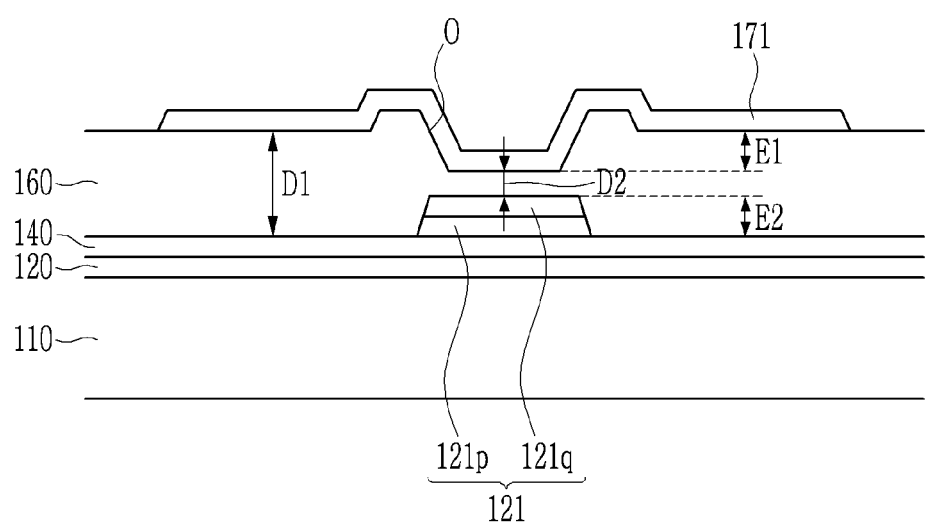

Next, as shown in FIG. 14 and FIG. 15, the data line 171 with the first source electrode 176a, the driving voltage line 172 with the second source electrode 176b, the first drain electrode 177a, and the second drain electrode 177b are formed on the first interlayer insulating layer 160.

As described above, the first interlayer insulating layer 160 has the first thickness D1 at the portion where the gate line 121 and the data line 171 do not overlap each other, and has the second thickness D2 less smaller than the first thickness D1 at the portion where the gate line 121 and the data line 171 overlap each other. Since the recess portion O lowers surficial height of the first interlayer insulating layer 160, the step B1 formed in the first interlayer insulating layer 160 is smaller than the step B2 formed by the gate line 121 disposed below the first interlayer insulating layer 160. As such, the data line 171 is disposed on the first interlayer insulating layer 160 with the small step, such that it is possible to prevent the thickness of the data line 171 from becoming thin or the data line 171 from being cut in a region where the gate line 121 when the data line 171 overlap each other, and it is also possible to increase the thickness of the data line 171 formed inside the recess portion O.

Next, as shown in FIG. 4 and FIG. 5, the second interlayer insulating layer 180 provided with the second contact hole 82, the first electrode 191, the pixel defining layer 195, the organic emission layer 370, and the second electrode 270 are sequentially formed.

Hereinafter, a manufacturing method of a display device according to another exemplary embodiment will be described with reference to FIG. 16 to FIG. 21 together with FIG. 8 and FIG. 9. FIG. 16 to FIG. 21 are cross-sectional views for illustrating a manufacturing method of a display device according to another exemplary embodiment.

Figure 16:
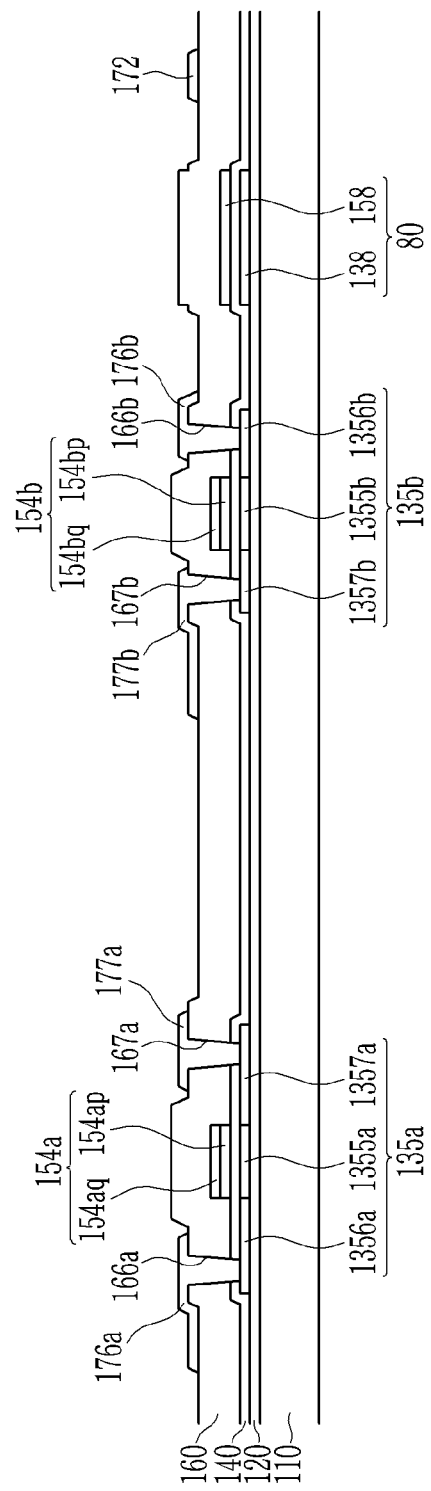
FIG. 16, FIG. 17, FIG. 18, FIG. 19, FIG. 20, and FIG. 21 are cross-sectional views for illustrating a manufacturing method of a display device according to another exemplary embodiment.
Figure 17:
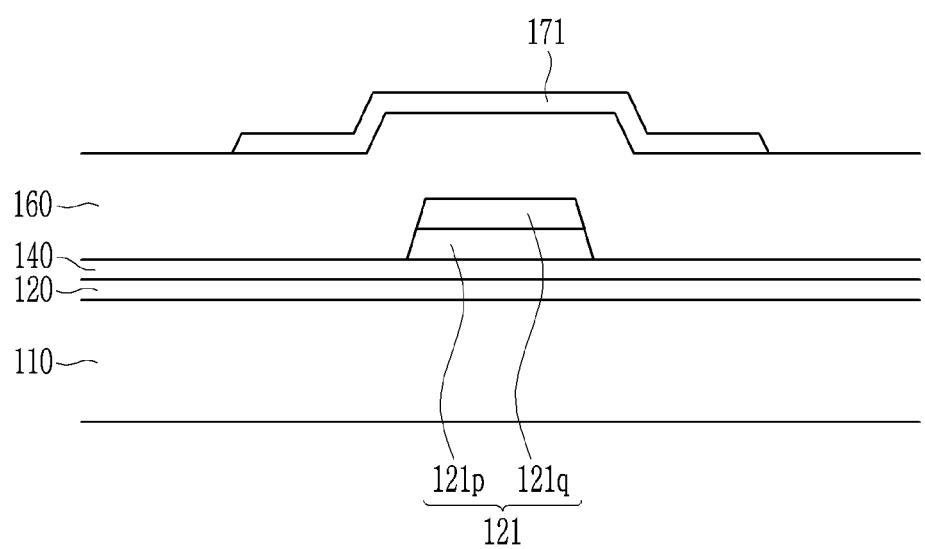

Referring to FIG. 16 and FIG. 17, the buffer layer 120, the first semiconductor 135a, the second semiconductor 135b, the first capacitor electrode 138, the gate insulating layer 140, the gate line 121, the first gate electrode 154a, the second gate electrode 154b, and the second capacitor electrode 158 are sequentially formed. The first interlayer insulating layer 160 is stacked thereon, the first source contact hole 166a for exposing the first source region 1356a of the first semiconductor 135a, the first drain contact hole 167a for exposing the first drain region 1357a of the first semiconductor 135a, the second source contact hole 166b for exposing the second source region 1356b of the second semiconductor 135b, and the second drain contact hole 167b for exposing the second drain region 1357b of the second semiconductor 135b are formed in the first interlayer insulating layer 160 and the gate insulating layer 140. The data line 171 with the first source electrode 176a, the driving voltage line 172 with the second source electrode 176b, the first drain electrode 177a, and the second drain electrode 177b are formed on the first interlayer insulating layer 160.

Figure 18:
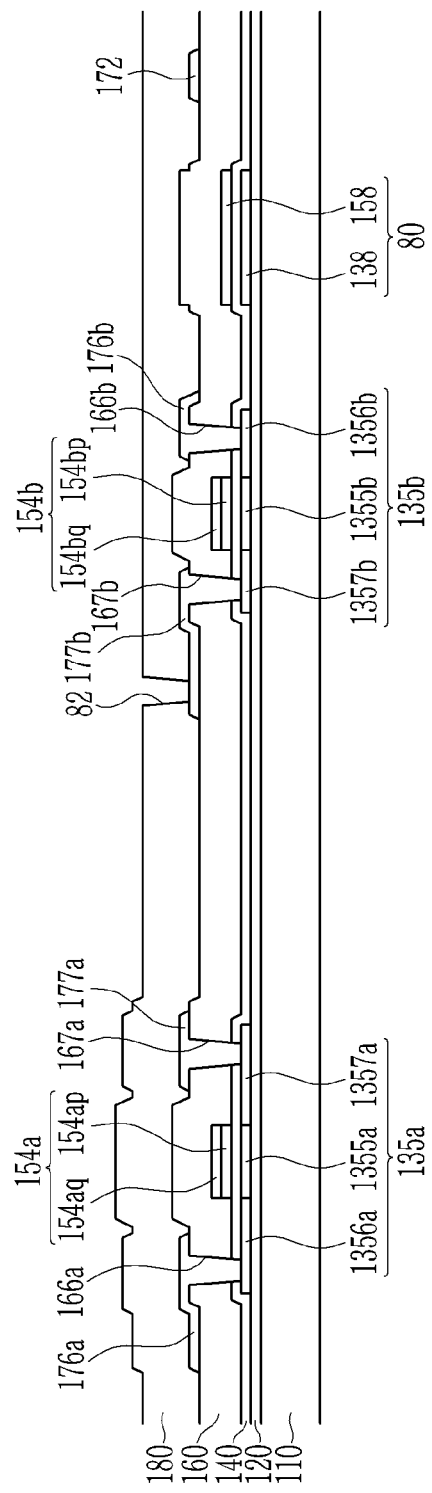
Figure 19:
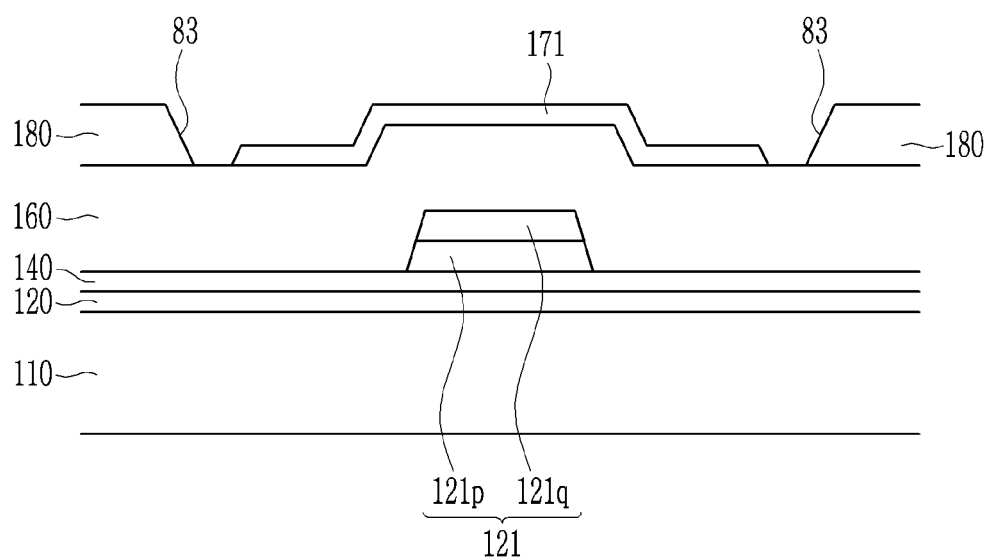

Referring to FIG. 18 and FIG. 19, the second interlayer insulating layer 180 provided with the second contact hole 82 for exposing the second drain electrode 177b and the opening 83 for exposing the data line 171 disposed in a region overlapping with the gate line 121 are formed on the data line 171 with the first source electrode 176a, the driving voltage line 172 with the second source electrode 176b, the first drain electrode 177a, and the second drain electrode 177b.

Figure 20:
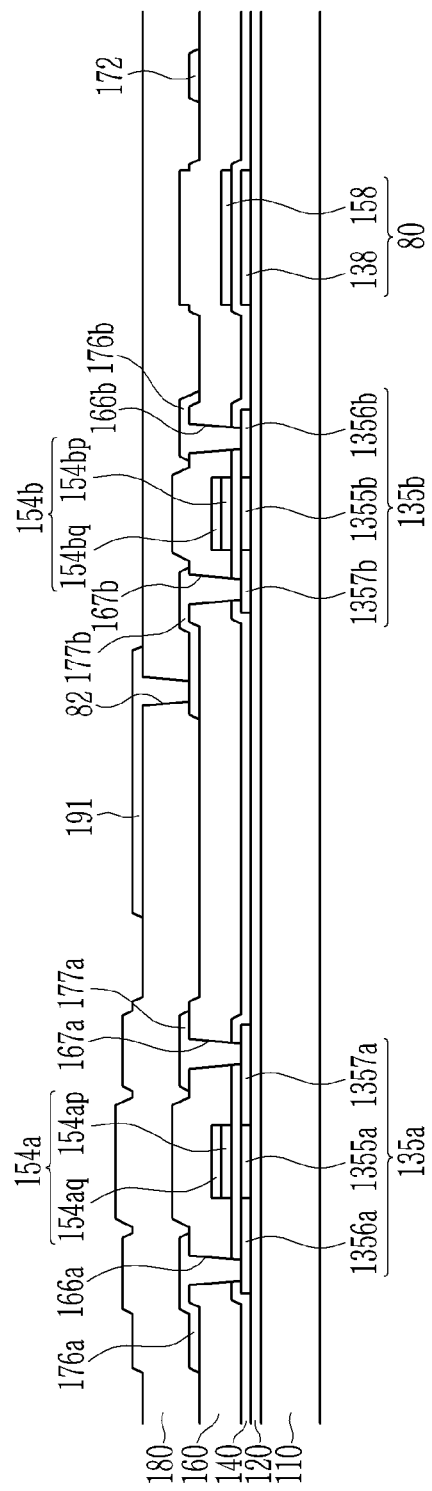
Figure 21:
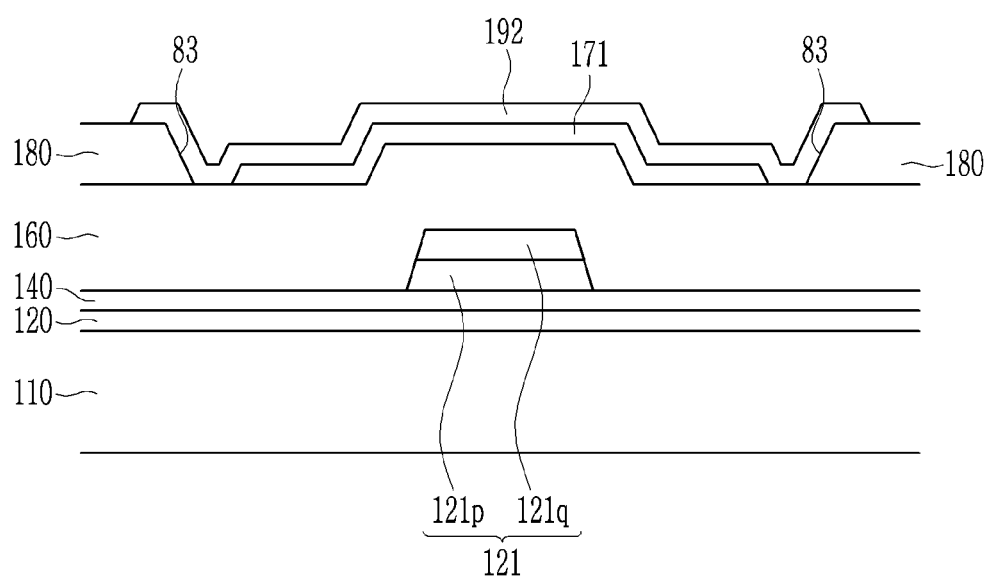

As shown in FIG. 20 and FIG. 21, the first electrode 191 corresponding to a pixel electrode connected to the second drain electrode 177b through the second contact hole 82, and the protecting electrode 192 for covering the data line 171 disposed in the region overlapping with the gate line 121 in the opening 83 of the second interlayer insulating layer 180 are formed on the second interlayer insulating layer 180. The first electrode 191 and the protecting electrode 192 may be simultaneously formed in the same layer.

As such, since the protecting electrode 192 for covering the gate line 121 and the data line 171 disposed in the region overlapping with the gate line 121 is simultaneously formed together with the first electrode 191, by covering and protecting the data line 171 disposed in the region where the gate line 121 and the data line 171 overlap each other with the protecting electrode 192 without an additional process, the influence from the damage of the data line 171 due to the step may be substantially reduced or eliminated.

Next, as shown in FIG. 4 and FIG. 5, the pixel defining layer 195, the organic emission layer 370, and the second electrode 270 are sequentially formed.

Now, a manufacturing method of a display device according to another exemplary embodiment will be described with reference to FIG. 22 to FIG. 25 together with FIG. 10. FIG. 22 to FIG. 25 are cross-sectional views for illustrating a manufacturing method of a display device according to an exemplary embodiment. In the illustrated exemplary embodiment, a detailed description for the structure of the pixel described above will be omitted to avoid redundancy.

Figure 22:
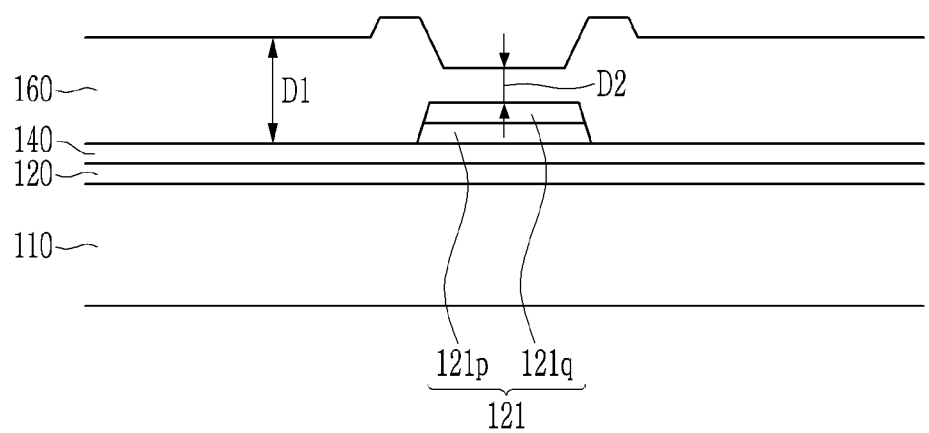
FIG. 22, FIG. 23, FIG. 24, and FIG. 25 are cross-sectional views for illustrating a manufacturing method of a display device according to still another exemplary embodiment.

As shown in FIG. 22, the buffer layer 120, the gate insulating layer 140, and the gate line 121 are formed on the substrate 110, and the recess portion O is formed in the first interlayer insulating layer 160 to have the second thickness D2 less than the first thickness D1 to provide low surficial height at the portion where the gate line 121 and the data line 171 overlap each other. The first interlayer insulating layer 160 has the first thickness D1 at a portion where the gate line 121 and the data line 171 do not overlap each other.

In this case, as described above, the first semiconductor 135a and the second semiconductor 135b disposed on the buffer layer 120, the first capacitor electrode 138, the first gate electrode 154a, the second gate electrode 154b, and the second capacitor electrode 158 disposed on the gate insulating layer 140 may be formed on the substrate 110. Furthermore, the first source contact hole 166a for exposing the first source region 1356a of the first semiconductor 135a, the first drain contact hole 167a for exposing the first drain region 1357a of the first semiconductor 135a, the second source contact hole 166b for exposing the second source region 1356b of the second semiconductor 135b, and the second drain contact hole 167b for exposing the second drain region 1357b of the second semiconductor 135b may be formed in the first interlayer insulating layer 160 and the gate insulating layer 140.

In this case, the process of forming the contact holes 166a, 166b, 167a, and 167b in the first interlayer insulating layer 160, and the process of forming the recess portion O in the first interlayer insulating layer 160 may be performed simultaneously through a single exposure process by using a halftone mask. In addition, the first contact hole 81 for exposing the second gate electrode 154b may also be formed simultaneously in the first interlayer insulating layer 160.

Figure 23:
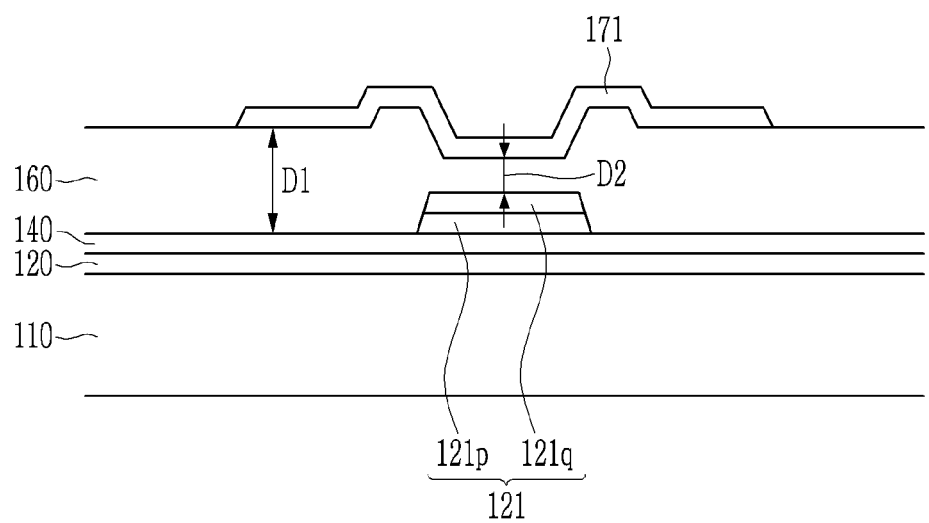

Next, as shown in FIG. 23, the data line 171 is formed on the first interlayer insulating layer 160. Although not shown, in this case, the first source electrode 176a, the driving voltage line 172 with the second source electrode 176b, the first drain electrode 177a, and the second drain electrode 177b may be formed.

Since the first interlayer insulating layer 160 has the first thickness D1 at the portion where the gate line 121 and the data line 171 do not overlap each other, and is provided with the recess portion O having the second thickness D2 less than the first thickness D1 at the portion where the gate line 121 and the data line 171 overlap each other, the step formed in the first interlayer insulating layer 160 is smaller than the step formed by the gate line 121 disposed below the first interlayer insulating layer 160. As such, the data line 171 is disposed on the first interlayer insulating layer 160 with the small step, such that it is possible to prevent the thickness of the data line 171 from becoming thin or the data line 171 from being cut in the region overlapping with the gate line 121 when the data line 171 is formed, and it is also possible to increase the thickness of the data line 171 formed inside the recess portion O.

Figure 24:
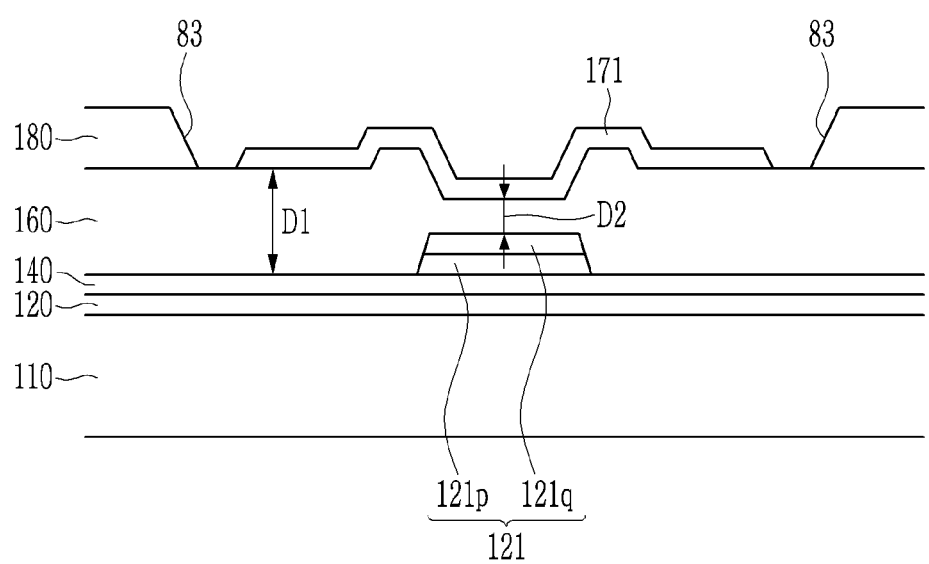

Next, as shown in FIG. 24, the second interlayer insulating layer 180 provided with the opening 83 for exposing the data line 171 disposed in the region overlapping with the gate line 121 is formed.

Although not shown, as in the exemplary embodiments described above, the second interlayer insulating layer 180 may be formed on the first source electrode 176a, the driving voltage line 172 with the second source electrode 176b, the first drain electrode 177a, and the second drain electrode 177b may be provided with the second contact hole 82 for exposing the second drain electrode 177b.

Figure 25:
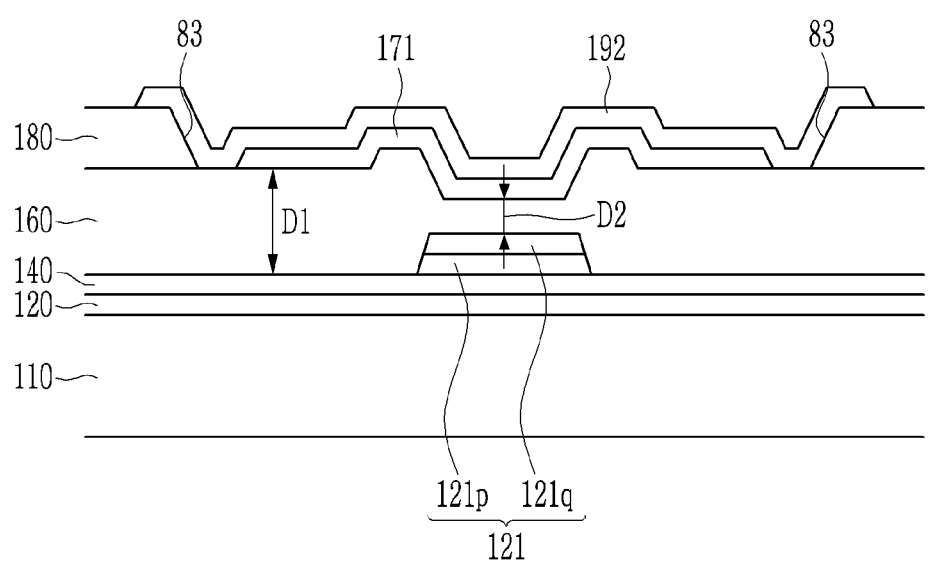

As shown in FIG. 25, the protecting electrode 192 for covering the data line 171 disposed in the region overlapping with the gate line 121 is formed in the opening 83 of the second interlayer insulating layer 180.

Although not shown, as in the exemplary embodiments described above, the first electrode 191 corresponding to a pixel electrode connected to the second drain electrode 177b through the second contact hole 82 may be formed on the second interlayer insulating layer 180, and the first electrode 191 and the protecting electrode 192 may be simultaneously formed in the same layer.

As such, since the protecting electrode 192 covering the gate line 121 and the data line 171 disposed in the region overlapping with the gate line 121 is simultaneously formed together with the first electrode 191, by covering and protecting the data line 171 disposed in the region where the gate line 121 and the data line 171 overlap each other with the protecting electrode 192 without an additional process, the influence from the damage of the data line 171 due to the step may be substantially reduced or eliminated.

Next, as shown in FIG. 10, the pixel defining layer 195, the organic emission layer 370, and the second electrode 270 are sequentially formed.

According to the exemplary embodiments, since the thickness of the first interlayer insulating layer 160 is reduced in the region where the gate line 121 and the data line 171 overlap each other by forming the recess portion O to provide low height, a step formed in the first interlayer insulating layer 160 becomes smaller than that formed by the gate line 121 disposed below the first interlayer insulating layer 160. In this manner, the data line 171 is disposed on the first interlayer insulating layer 160 with the small step, as such, it is possible to prevent the thickness of the data line 171 from becoming thin or the data line 171 from being cut in the region overlapping with the gate line 121 when the data line 171 is formed, and it is also possible to increase the thickness of the data line 171 formed inside the recess portion O.

In addition, the data line 171 disposed in the region where the gate line 121 and the data line 171 overlap each other is covered by the protecting electrode 192. By covering and protecting the data line 171 disposed in the region where the gate line 121 and the data line 171 overlap each other with the protecting electrode 192, the influence of the damage of the data line 171 due to the step may be substantially reduced or eliminated.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first signal line disposed on a substrate;
   a first insulating layer disposed on the first signal line; and
   a second signal line disposed on the first insulating layer and crossing the first signal line,
   wherein:
   the first insulating layer comprises a recess portion providing a surface height lower than other areas of the first insulating layer; and
   the first signal line and the second signal line overlap each other with the recess portion therebetween.

2. The display device of claim 1, wherein the first signal line is a gate line and the second signal line is a data line.

3. The display device of claim 1, further comprising an organic emission layer disposed on the substrate,
   wherein the first signal line is a gate line, and the second signal line is a driving voltage line configured to apply a driving voltage to the organic emission layer.

4. The display device of claim 1, further comprising:
   a second insulating layer disposed on the second signal line; and
   a protecting electrode,
   wherein:
   the second insulating layer has an opening that exposes the second signal line disposed in a region where the first signal line and the second signal line overlap each other; and
   the protecting electrode is disposed in the opening and covers the second signal line.

5. The display device of claim 4, further comprising a pixel electrode disposed on the substrate,
   wherein the protecting electrode and the pixel electrode comprise the same material.

6. The display device of claim 4, wherein the first signal line is a gate line, and the second signal line is a data line.

7. The display device of claim 4, further comprising an organic emission layer disposed on the substrate,
   wherein the first signal line is a gate line, and the second signal line is a driving voltage line configured to apply a driving voltage to the organic emission layer.

8. A manufacturing method of a display device, comprising:
   forming a first signal line on a substrate;
   forming a first insulating layer comprising a recess portion to provide a surface height lower than other areas of the first insulating layer on the first signal line; and forming, on the first insulating layer, a second signal line crossing the first signal line in the recess portion of the first insulating layer.

9. The method claim 8, wherein the first signal line is a gate line, and the second signal line is a data line.

10. The method of claim 8, further comprising forming an organic emission layer on the substrate,
wherein the first signal line is a gate line, and the second signal line is a driving voltage line to apply a driving voltage to the organic emission layer.

11. The method of claim 8, further comprising:
forming, on the second signal line, a second insulating layer having an opening that exposes the second signal line disposed in a region where the first signal line and the second signal line overlap each other; and
forming a protecting electrode covering the second signal line in the opening.

12. The method of claim 11, further comprising forming a pixel electrode on the substrate,
wherein the protecting electrode and the pixel electrode are simultaneously formed in the same layer.

13. The method of claim 11, wherein the first signal line is a gate line, and the second signal line is a data line.

14. The method of claim 11, further comprising forming an organic emission layer on the substrate,
wherein the first signal line is a gate line, and the second signal line is a driving voltage line to apply a driving voltage to the organic emission layer.

15. The method of claim 14, further comprising forming a first electrode and a second electrode overlapping the organic emission layer,
wherein the protecting electrode and the first electrode are simultaneously formed in the same layer.

16. A display device comprising,
a first signal line disposed on a substrate;
a first insulating layer disposed on the first signal line; and
a second signal line disposed on the first insulating layer and crossing the first signal line,
wherein:
the first insulating layer has a first thickness and a second thickness less than the first thickness;
the first insulating layer has the second thickness in an area where the first signal line and the second signal line cross each other.

17. The display device of claim 16, wherein the first insulating layer has a third thickness greater than the first thickness in an area of the first insulating between the first and second thicknesses.

18. The display device of claim 17, wherein the second signal line overlaps each portion of the first insulating layer having the first, second, and third thicknesses.

19. The display device of claim 16, wherein the second signal line has a greater thickness in an area overlapping the first signal line.

20. The display device of claim 16, wherein a vertical distance from an upper surface of the first signal line to the substrate is greater than a vertical distance from a lower surface of the second signal line to the upper surface of the first signal line.

* * * * *